(12) United States Patent
Chuang

(10) Patent No.: US 7,315,333 B2
(45) Date of Patent: Jan. 1, 2008

(54) TV TUNERS AND METHODS THEREOF

(75) Inventor: Shun-Chi Chuang, Tainan (TW)

(73) Assignee: Himax Technologies, Inc., Tainan County (TW)

( * ) Notice: Subject to any disclaimer, the term of this patent is extended or adjusted under 35 U.S.C. 154(b) by 479 days.

(21) Appl. No.: 11/001,506

(22) Filed: Nov. 30, 2004

(65) Prior Publication Data

US 2005/0122437 A1 Jun. 9, 2005

(30) Foreign Application Priority Data

Dec. 5, 2003 (TW) .............................. 92134309 A

(51) Int. Cl.
*H04N 5/50* (2006.01)
(52) U.S. Cl. ...................... 348/731; 348/726
(58) Field of Classification Search ........ 348/731–733, 348/725–728; 455/178.1, 182.1, 182.2, 182.3, 455/189.1, 190.1, 191.1, 191.3, 192.1, 192.2, 455/192.3; *H04N 5/50, 5/44*
See application file for complete search history.

(56) References Cited

U.S. PATENT DOCUMENTS 5,737,035 A 4/1998 Rotzoll ........................ 348/725
6,438,361 B1* 8/2002 Chong et al. ................ 348/731

* cited by examiner

*Primary Examiner*—Sherrie Hsia
(74) *Attorney, Agent, or Firm*—Thomas, Kayden, Horstemeyer & Risley

(57) ABSTRACT

TV tuners and methods thereof are provided. A TV tuner includes a first frequency converting circuit, a second frequency converting circuit, and a demodulator. The first frequency converting circuit, switchable between a first operating mode and a second operating mode, receives an RF signal and outputs a converted signal by performing high-side injection on the RF signal in the first operating mode and performing frequency addition on the RF signal in the second operating mode. The second frequency converting circuit performs a down conversion on the converted signal from the first frequency converting circuit to obtain an intermediate frequency signal. The demodulator demodulates the intermediate frequency signal and outputs a baseband frequency signal comprising video and audio signals.

28 Claims, 8 Drawing Sheets

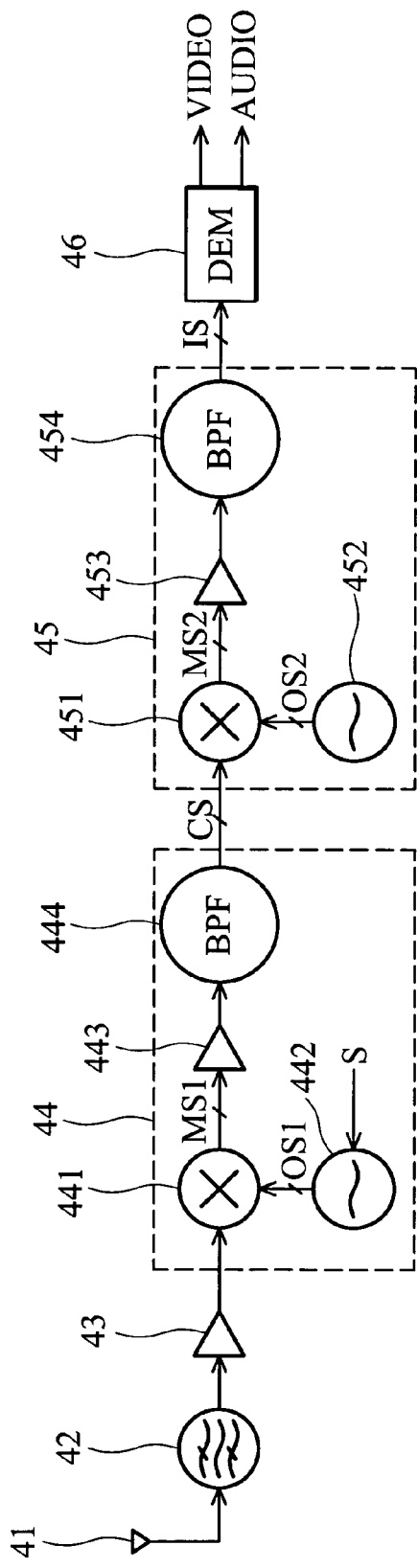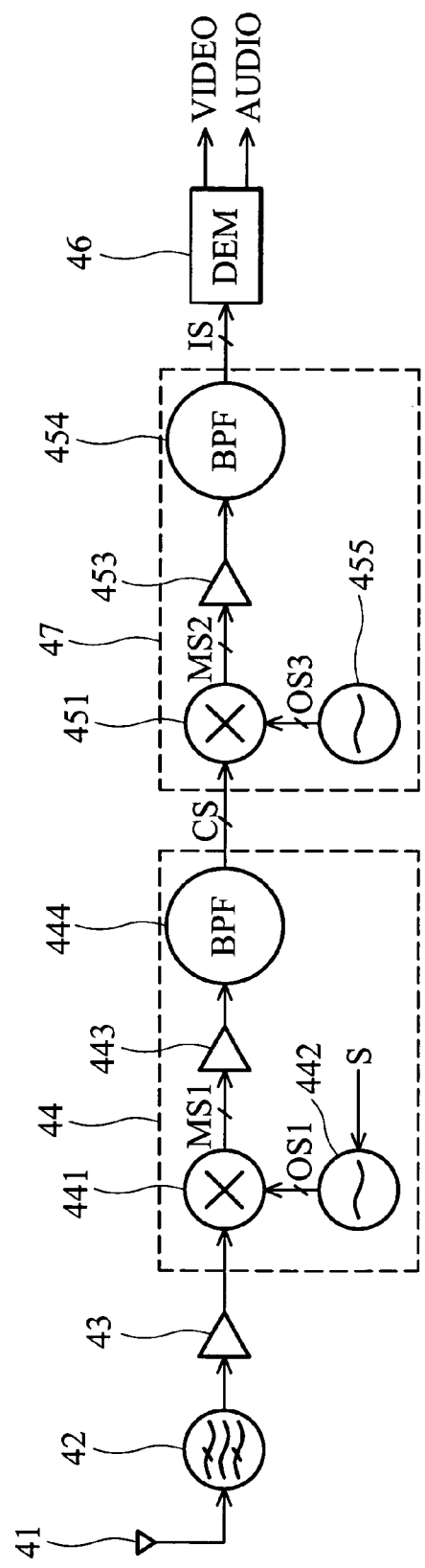
FIG. 4A
FIG. 4B

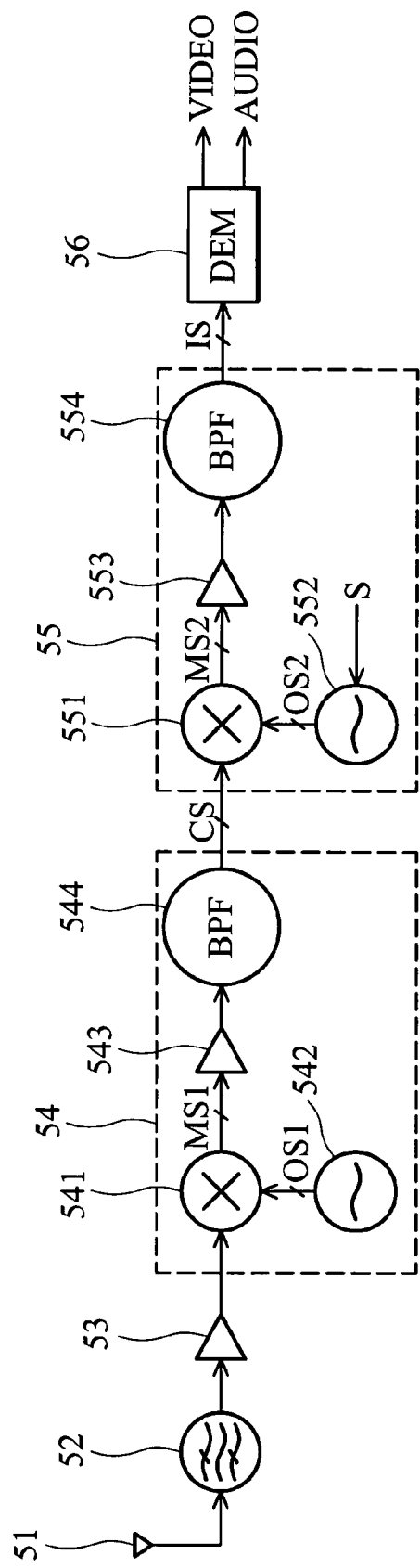
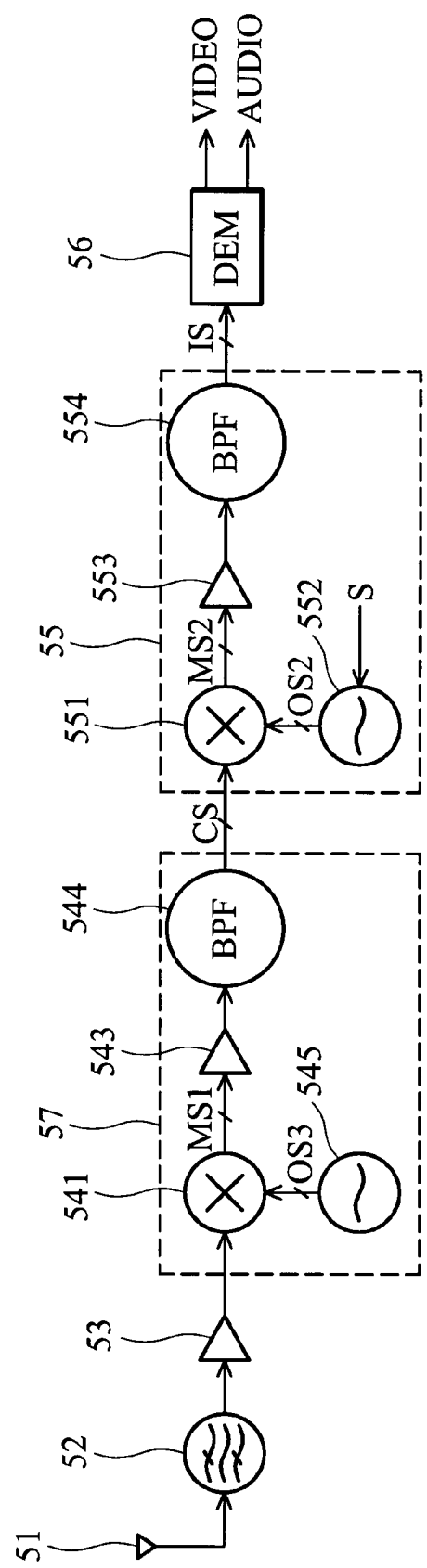
FIG. 5A
FIG. 5B

TV TUNERS AND METHODS THEREOF

BACKGROUND

The invention relates to TV tuners, and in particular, to TV tuners for television systems.

FIG. 1 shows a conventional down-conversion TV tuner, comprising a phase locked loop 11, an input tuning circuit 12, a radio frequency (RF) amplifier 13, an intermediate tuning circuit 14, an oscillator 15, a mixer 16, a band-pass filter 17, an intermediate amplifier 18 and a demodulator 19.

When an output signal of the RF amplifier 13 has a carrier frequency fc, the oscillator 15 has an oscillation frequency $f_{LO}$, and an intermediate frequency signal output from the mixer 16 has a frequency $f_{IF}$, according to the formula:

$$f_{IF} = f_{LO} - fc$$

Accordingly, oscillation frequency $f_{LO}$ is higher than the carrier frequency fc of the output signal, input to the mixer 16. In this case, the down-conversion TV tuner refers to a superheterodyne receiver, and operation in the mixer 16 is defined as high-side injection. In the down-conversion TV tuner, however, image frequency and the intermediate frequency signal mix together, inducing deterioration of image quality thereof.

FIG. 2 shows a double-conversion TV tuner as disclosed in U.S. Pat. No. 5,737,035. RF signal received by an antenna 202 is transmitted to the input tuning circuit 204, amplified by the low-noise transconductance amplifier (LNTA) 206, and sent to the mixers 208 and 210. Mixers 208 and 210 mix the received signals with oscillation signals generated by the oscillators 250 and 212, outputting an intermediate frequency signal from the mixer 210. An input signal of the mixer 208 has a carrier frequency of 0 to 900 MHz, and an input signal of the mixer 210 has a carrier frequency of 1200 MHz. The oscillator 250 has an oscillation frequency of 1200 to 2100 MHz, and the oscillator 212 has an oscillation frequency of 1180 MHz. In this case, the oscillation frequency of the oscillator 250 is higher than the carrier frequency of the input signal of the mixer 208, and the mixer 208 performs high-side injection. Alternatively, the oscillation frequency of the oscillator 212 is lower than the carrier frequency of the input signal of the mixer 210, so the mixer 210 performs low-side injection.

TV tuners can be designed differently in accordance with application in different systems. Accordingly, conventional TV tuners are categorized as single-system TV tuners for NTSC(M) or PAL(M/N, B/G, D, I) TV systems and multi-system TV tuners for NTSC(M) and PAL(M/N, B/G, D, I), or SECAM(B/G, D/K, I, L/L') and PAL(M/N, B/G, D, I) TV systems. There is need for a TV tuner applicable in both single-system and multi-system TV systems.

In the TV systems, however, L' system is significantly different from other TV systems in bandwidth and carrier frequency of the audio signal. Accordingly, cost of a conventional TV tuner applicable to all TV systems is high.

FIG. 3A shows a frequency spectrum diagram of a single-conversion of M/N, B/G, D/K, I and L TV systems. The carrier frequency Sc of the RF audio signal is higher than the carrier frequency Pc of the RF video signal. The RF signals undergo single-conversion such that the carrier frequency Sc' of the intermediate frequency audio signal is lower than the carrier frequency Pc' of the intermediate frequency video signal. In FIG. 3B, however, a frequency spectrum diagram of L' TV system shows that the carrier frequency Sc of the RF audio signal is lower than the carrier frequency Pc of the RF video signal. The RF signals undergo single-conversion such that the carrier frequency Sc' of the intermediate frequency audio signal is higher than the carrier frequency Pc' of the intermediate frequency video signal. Thus, in the conventional TV tuner with single-conversion, an additional double band-pass surface acoustic wave (SAW) filter with dual Nyquist slope is required to filter the converted intermediate frequency signal.

Further, in the conventional TV tuner with double-conversion, two mixers perform high-side injection and low-side injection respectively such that frequency spectrum diagrams are similar to those in single-converse. Thus, an additional SAW filter is required.

SUMMARY

TV tuners are provided. An exemplary embodiment of a TV tuner receiving a radio frequency (RF) signal comprises a first frequency converting circuit and a second frequency converting circuit. The first frequency converting circuit, switchable between a first operating mode and a second operating mode, receives the RF signal and outputs a converted signal by performing high-side injection on the RF signal in the first operating mode, and performing frequency addition on the RF signal in the second operating mode. The second frequency converting circuit performs a down conversion on the converted signal to obtain an intermediate frequency signal. A demodulator can be provided to demodulate the intermediate frequency signal and output a baseband frequency signal comprising video and audio signals.

Alternatively, the first frequency converting circuit can perform an up conversion on the RF signal to obtain a converted signal, and the second frequency converting circuit, switchable between a first operating mode and a second operating mode, can receive the converted signal and output an intermediate frequency signal by performing low-side injection on the converted signal in the first operating mode and performing high-side injection on the converted signal in the second operating mode.

Methods of TV tuning are also provided. An exemplary embodiment of a TV tuning method for receiving a radio frequency (RF) signal with video and audio signals comprises selecting a first operating mode or a second operating mode according to a preset parameter or an automatically defined parameter, converting frequency of the RF signal to obtain a converted signal by performing high-side injection on the RF signal when the first operating mode is selected, and performing frequency addition on the RF signal when the second operating mode is selected, converting frequency of the converted signal to obtain an intermediate frequency signal by performing a down conversion, and demodulating the intermediate frequency signal to output the video and audio signals.

Alternatively, an up conversion and frequency conversion of the converted signal to obtain an intermediate frequency signal by performing low-side injection on the RF signal can occur in the first operating mode, and high-side injection on the RF signal can be performed in the second operating mode.

DESCRIPTION OF THE DRAWINGS

TV tuners and methods thereof can be more fully understood by reading the subsequent detailed description and examples with references made to the accompanying drawings, wherein:

FIG. 4A is a schematic view of an embodiment of a TV tuner.

FIG. 4B is a schematic view of an embodiment of a TV tuner.

FIG. 5A is a schematic view of an embodiment of a TV tuner.

FIG. 5B is a schematic view of an embodiment of a TV tuner.

DETAILED DESCRIPTION

Figure 1:
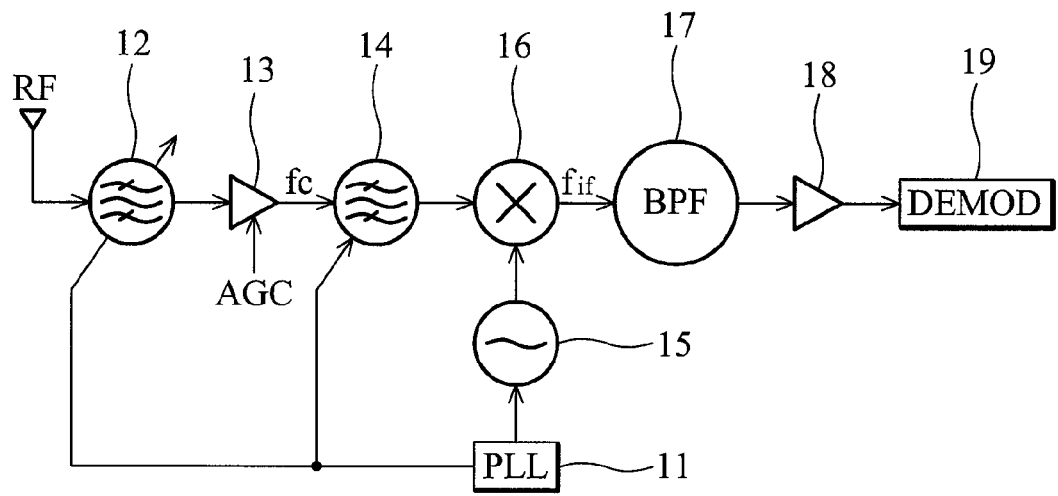
FIG. 1 is a schematic view of a conventional down-conversion TV tuner.
Figure 2:
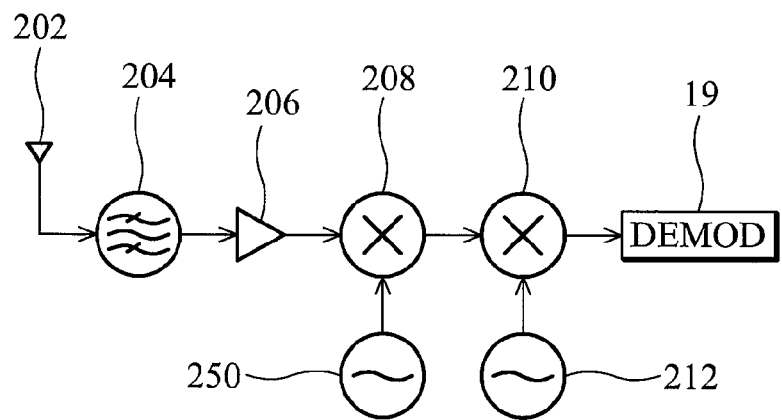
FIG. 2 is a schematic view of a conventional double-conversion TV tuner.
Figure 3A:
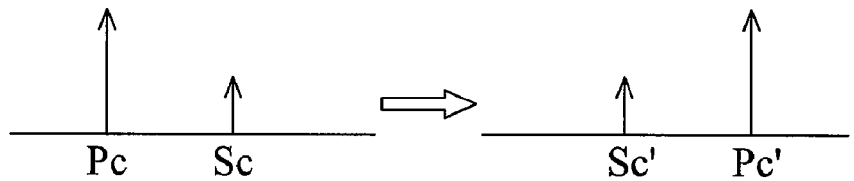
FIG. 3A is a frequency spectrum diagram of a single-conversion of M/N, B/G, D/K, I and L TV systems.
Figure 3B:
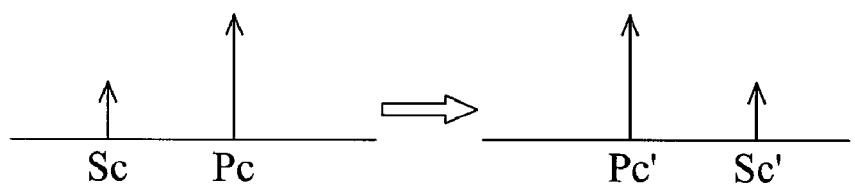
FIG. 3B is a frequency spectrum diagram of a single-conversion of L' TV system.

FIG. 4A shows an embodiment of a TV tuner, comprising an antenna 41, an input tuning circuit 42, an amplifier 43, a first frequency converting circuit 44, a second frequency converting circuit 45, and a demodulator 46. RF signal comprising video and audio signals received by the antenna 41 of the TV tuner is transmitted to the input tuning circuit 42 and the amplifier 43 and sent to the first frequency converting circuit 44. Alternatively, the RF signal can be sent to the first frequency converting circuit 44 directly, via the input tuning circuit 42, or the amplifier 43. Besides, the RF signal can also be received by wired transmission (such as cable) instead of the antenna 41.

The first frequency converting circuit 44, switchable between a first operating mode and a second operating mode according to a preset parameter or an automatically defined parameter S, receives the RF signal and outputs a converted signal CS. In the first operating mode, the first frequency converting circuit 44 performs high-side injection on the RF signal to obtain the converted signal CS. In the second operating mode, the first frequency converting circuit 44 performs frequency addition on the RF signal to obtain the converted signal CS. The first and second operating modes relate to up conversions.

The first frequency converting circuit 44 comprises an oscillator 442, a mixer 441, an amplifier 443, and a band-pass filter 444. The oscillator 442 generates an oscillation signal OS1. The mixer 441 receives the RF signal and the oscillation signal OS1 to output a mixed signal MS1. In the first operating mode, frequency of the oscillation signal OS1 is higher than a carrier frequency of the RF signal. In the second operating mode, frequency of the oscillation signal OS1 is lower than a carrier frequency of the mixed signal MS1. For example, in the first operating mode, an RF signal with a carrier frequency of 100 MHz undergoes high-side injection with an oscillation signal OS1 of 1320 MHz to obtain a mixed signal MS1 with a carrier frequency of 1220 MHz. In the second operating mode, the RF signal with a carrier frequency of 100 MHz undergoes frequency addition with an oscillation signal OS1 of 1120 MHz to obtain a mixed signal MS1 with a carrier frequency of 1220 MHz.

The amplifier 443 amplifies the mixed signal MS1. The band-pass filter 444 filters the amplified mixed signal to output the converted signal CS.

Alternatively, converted signal CS can also be obtained directly from the mixed signal MS1, or with either the amplifier 443 or the band-pass filter 444.

The second frequency converting circuit 45 performs a down conversion on the converted signal CS from the first frequency converting circuit 44, obtaining an intermediate frequency signal IS by performing low-side injection. The second frequency converting circuit 45 comprises an oscillator 452, a mixer 451, an amplifier 453, and a band-pass filter 454. The oscillator 452 generates an oscillation signal OS2, with frequency of the oscillation signal OS2 lower than a carrier frequency of the converted signal CS. The mixer 451 receives the converted signal CS and the oscillation signal OS2 to obtain a mixed signal MS2. For example, a converted signal CS with a carrier frequency of 1220 MHz undergoes low-side injection with an oscillation signal OS2 of 1180 MHz to obtain a mixed signal MS2 with a carrier frequency of 40 MHz. The amplifier 453 amplifies the mixed signal MS2. The band-pass filter 454 filters the amplified mixed signal to output the intermediate frequency signal IS.

Alternatively, the intermediate frequency signal IS can also be obtained directly from the mixed signal MS2, or with either the amplifier 453 or the band-pass filter 454.

The demodulator 46 demodulates the intermediate frequency signal IS and outputs a baseband frequency signal comprising video signal VIDEO and audio signal AUDIO, or outputs the signals individually.

When the TV tuner is applied in a TV system other than an L' TV system, the first frequency converting circuit 44 can be set to the first operating mode according to the preset parameter S. In this case, the first frequency converting circuit 44 and the second frequency converting circuit 45 respectively perform high-side injection and low-side injection, similar to the conventional double-conversion TV tuner. Alternatively, when the TV tuner is applied in an L' TV system, the first frequency converting circuit 44 can be set to the second operating mode according to the preset parameter S. In this case, the first frequency converting circuit 44 and the second frequency converting circuit 45 respectively perform frequency addition and low-side injection. The first frequency converting circuit 44 can also be preset to the first operating mode when the TV tuner is applied in an L' TV system and in the second mode when applied in a TV system other than the L' TV system.

As shown in FIG. 4B, a second frequency converting circuit 47 alternatively performs a down conversion on the converted signal CS from the first frequency converting circuit 44, obtaining an intermediate frequency signal IS by performing high-side injection. The second frequency converting circuit 47 comprises an oscillator 455, a mixer 451, an amplifier 453, and a band-pass filter 454. The oscillator 455 generates an oscillation signal OS3, and frequency of the oscillation signal OS3 is higher than a carrier frequency of the converted signal CS. The mixer 451 receives the converted signal CS and the oscillation signal OS3 to obtain a mixed signal MS2. For example, a converted signal CS with a carrier frequency of 1220 MHz undergoes high-side injection with an oscillation signal OS3 of 1260 MHz to obtain a mixed signal MS2 with a carrier frequency of 40 MHz. The amplifier 453 amplifies the mixed signal MS2. The band-pass filter 454 filters the amplified mixed signal to output the intermediate frequency signal IS.

In the second embodiment, when the TV tuner is applied in a TV system other than an L' TV system, the first frequency converting circuit 44 can be set to the second operating mode according to the preset parameter S. Here, the first frequency converting circuit 44 and the second frequency converting circuit 47 respectively perform frequency addition and high-side injection. Alternatively, when the TV tuner is applied in an L' TV system, the first frequency converting circuit 44 can be set to the first operating mode according to the preset parameter S, and both the first frequency converting circuit 44 and the second frequency converting circuit 47 perform high-side injection. The first frequency converting circuit 44 can also be preset to the first mode when applied in a TV system other than an L' TV system and to the second operating mode when the TV tuner is applied in an L' TV system.

FIG. 5A shows an embodiment of a TV tuner, comprising an antenna 51, an input tuning circuit 52, an amplifier 53, a first frequency converting circuit 54, a second frequency converting circuit 55, and a demodulator 56. RF signal comprising video and audio signals received by the antenna 51 of the TV tuner is transmitted to the input tuning circuit 52 and the amplifier 53 and sent to the first frequency converting circuit 54. Alternatively, the RF signal can be sent to the first frequency converting circuit 54 directly, or either via the input tuning circuit 52 or the amplifier 53. Besides, the RF signal can also be received by wired transmission (such as cable) instead of the antenna 51.

The first frequency converting circuit 54 receives the RF signal and performs an up conversion on the RF signal, obtaining a converted signal CS by performing high-side injection. The first frequency converting circuit 54 comprises an oscillator 542, a mixer 541, an amplifier 543, and a band-pass filter 544. The oscillator 542 generates an oscillation signal OS1, with frequency higher than a carrier frequency of the RF signal. The mixer 541 receives the RF signal and the oscillation signal OS1 to output a mixed signal MS1. For example, an RF signal with a carrier frequency of 100 MHz undergoes high-side injection with an oscillation signal OS1 of 1320 MHz to obtain a mixed signal MS1 with a carrier frequency of 1220 MHz. The amplifier 543 amplifies the mixed signal MS1. The band-pass filter 544 filters the amplified mixed signal to output the converted signal CS.

Alternatively, the converted signal CS can also be obtained directly from the mixed signal MS1, or with either the amplifier 543 or the band-pass filter 544.

The second frequency converting circuit 55, switchable between a first operating mode and a second operating mode according to a preset parameter or an automatically defined parameter S, receives the converted signal CS and outputs an intermediate frequency signal IS. In the first operating mode, the second frequency converting circuit 55 performs low-side injection on the converted signal CS to obtain the intermediate frequency signal IS. In the second operating mode, the second frequency converting circuit 55 performs high-side injection on the converted signal CS to obtain the intermediate frequency signal IS. The low-side injection and high-side injection relate to down conversions. The second frequency converting circuit 55 comprises an oscillator 552, a mixer 551, an amplifier 553, and a band-pass filter 554. The oscillator 552 generates an oscillation signal OS2. In the first operating mode, frequency of the oscillation signal OS2 is lower than a carrier frequency of the converted signal CS. In the second operating mode, frequency of the oscillation signal OS2 is higher than a carrier frequency of the converted signal CS. The mixer 551 receives the converted signal CS and the oscillation signal OS2 to obtain a mixed signal MS2. For example, in the first operating mode, a converted signal CS with a carrier frequency of 1220 MHz undergoes low-side injection with an oscillation signal OS2 of 1180 MHz to obtain a mixed signal MS2 with a carrier frequency of 40 MHz. In the second operating mode, a converted signal CS with a carrier frequency of 1220 MHz undergoes high-side injection with an oscillation signal OS2 of 1260 MHz to obtain a mixed signal MS2 with a carrier frequency of 40 MHz. The amplifier 553 amplifies the mixed signal MS2. The band-pass filter 554 filters the amplified mixed signal to output the intermediate frequency signal IS.

Alternatively, the intermediate frequency signal IS can also be obtained directly from the mixed signal MS2, or with either the amplifier 553 or the band-pass filter 554.

The demodulator 56 demodulates the intermediate frequency signal IS and outputs a baseband frequency signal comprising video signal VIDEO and audio signal AUDIO, or outputs the signals individually.

When the TV tuner is applied in a TV system other than an L' TV system, the second frequency converting circuit 55 can be set to the first operating mode according to the preset parameter S. Here, the first frequency converting circuit 54 and the second frequency converting circuit 55 respectively perform high-side injection and low-side injection, similar to the conventional double-conversion TV tuner. Alternatively, when the TV tuner is applied in an L' TV system, the second frequency converting circuit 55 can be set to the second operating mode according to the preset parameter S, and both the first frequency converting circuit 54 and the second frequency converting circuit 55 perform high-side injection. The second frequency converting circuit 55 can also be preset to the first operating mode when the TV tuner is applied in an L' TV system and to the second mode when applied in a TV system other than the L' TV system.

FIG. 5B shows an embodiment of a TV tuner, in which, alternatively, the first frequency converting circuit 57 performs an up conversion on the RF signal, obtaining a converted signal CS by performing frequency addition. The first frequency converting circuit 57 comprises an oscillator 545, a mixer 541, an amplifier 543, and a band-pass filter 544. The oscillator 545 generates an oscillation signal OS3. Frequency of the oscillation signal OS3 is lower than a carrier frequency of the RF signal. The mixer 541 receives the RF signal and the oscillation signal OS3 to obtain a mixed signal MS1. For example, a RF signal with a carrier frequency of 100 MHz undergoes frequency addition with an oscillation signal OS3 of 1120 MHz to obtain a mixed signal MS1 with a carrier frequency of 1220 MHz. The amplifier 543 amplifies the mixed signal MS1. The band-pass filter 544 filters the amplified mixed signal to output the intermediate frequency signal IS.

When the TV tuner is applied in a TV system other than an L' TV system, the second frequency converting circuit 55 can be set to the second operating mode according to the preset parameter S. Here, the first frequency converting circuit 57 and the second frequency converting circuit 54 respectively perform frequency addition and high-side injection. Alternatively, when the TV tuner is applied in an L' TV system, the second frequency converting circuit 55 can be set to the first operating mode according to the preset parameter S. Here, the first frequency converting circuit 57 and the second frequency converting circuit 54 respectively perform frequency addition and low-side injection. The second frequency converting circuit 55 can also be preset to the first operating mode when applied in a TV system other than an L' TV system and to the second operating mode when the TV tuner is applied in the L' TV system.

Figure 6:
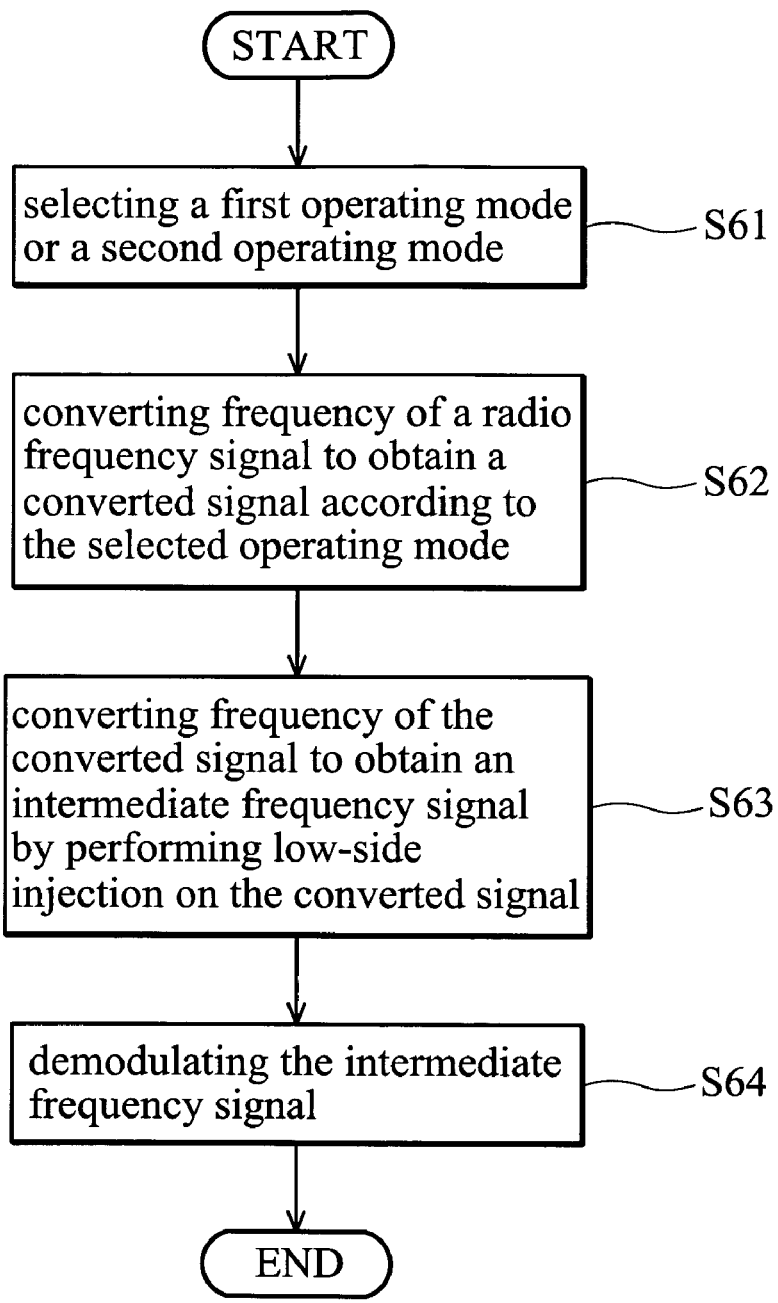
FIG. 6 is a flow chart of an embodiment of a TV tuning method.

FIG. 6 is a flow chart of an embodiment of a TV tuning method.

In step S61, a first operating mode or a second operating mode is selected according to a preset parameter or an automatically defined parameter.

In step S62, frequency of the RF signal is converted to obtain a converted signal. When the first operating mode is selected, the converted signal is obtained by performing high-side injection on the RF signal. When the second operating mode is selected, the converted signal is obtained by performing frequency addition on the RF signal. The first and second operating modes relate to up conversions.

In step S63, frequency of the converted signal is converted to obtain an intermediate frequency signal by a down conversion, which comprises low-side injection, on the converted signal.

In step S64, the intermediate frequency signal is demodulated to output a baseband frequency signal comprising video and audio signals, or to output the signals individually.

Figure 7:
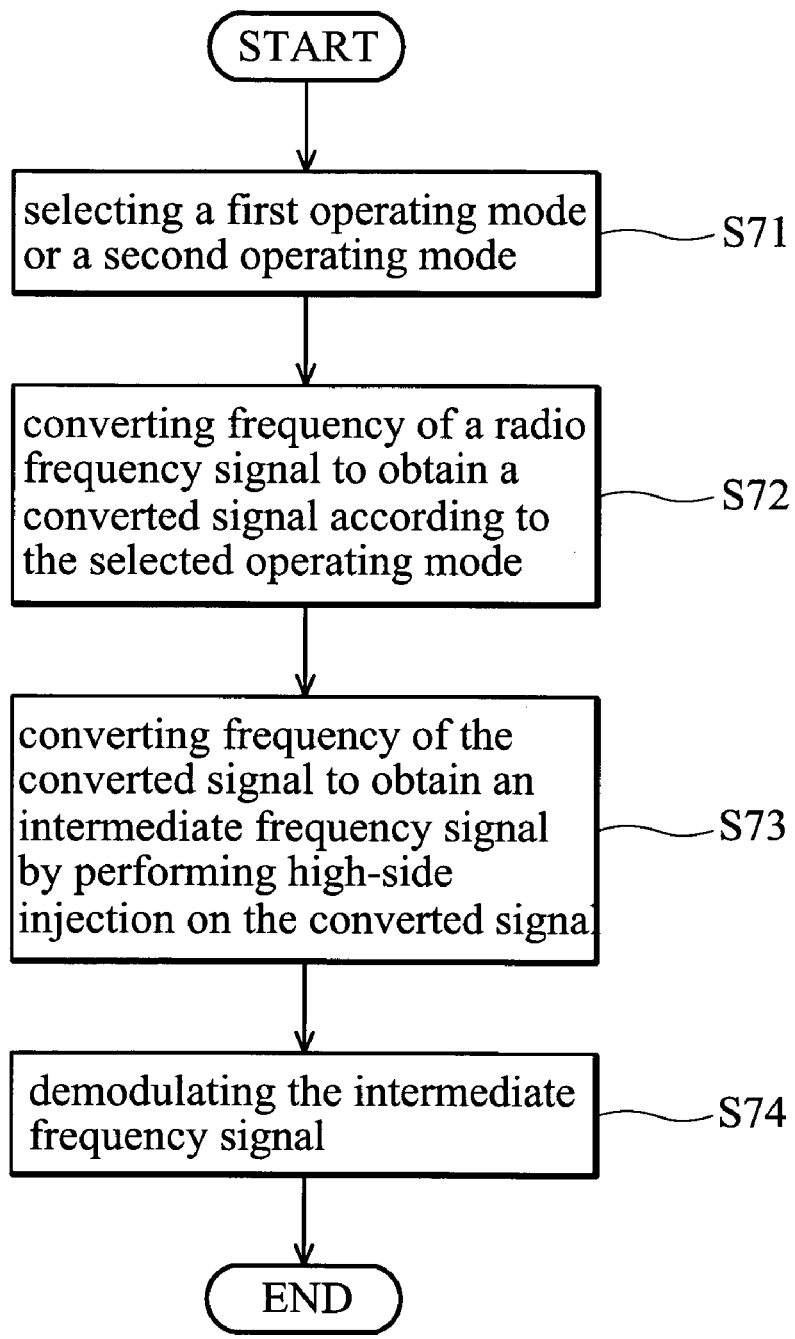
FIG. 7 is a flow chart of an embodiment of a TV tuning method.

As shown in FIG. 7, in step S71, a first operating mode or a second operating mode is selected according to a preset parameter or an automatically defined parameter.

In step S72, frequency of the RF signal is converted to obtain a converted signal. When the first operating mode is selected, the converted signal is obtained by performing high-side injection on the RF signal. When the second operating mode is selected, the converted signal is obtained by performing frequency addition on the RF signal. The first and second operating modes relate to up conversions.

In step S73, frequency of the converted signal is converted to obtain an intermediate frequency signal, by a down conversion, which comprises high-side injection, on the converted signal.

In step S74, the intermediate frequency signal is demodulated to output a baseband frequency signal comprising video and audio signals, or to output the signals individually.

Figure 8:
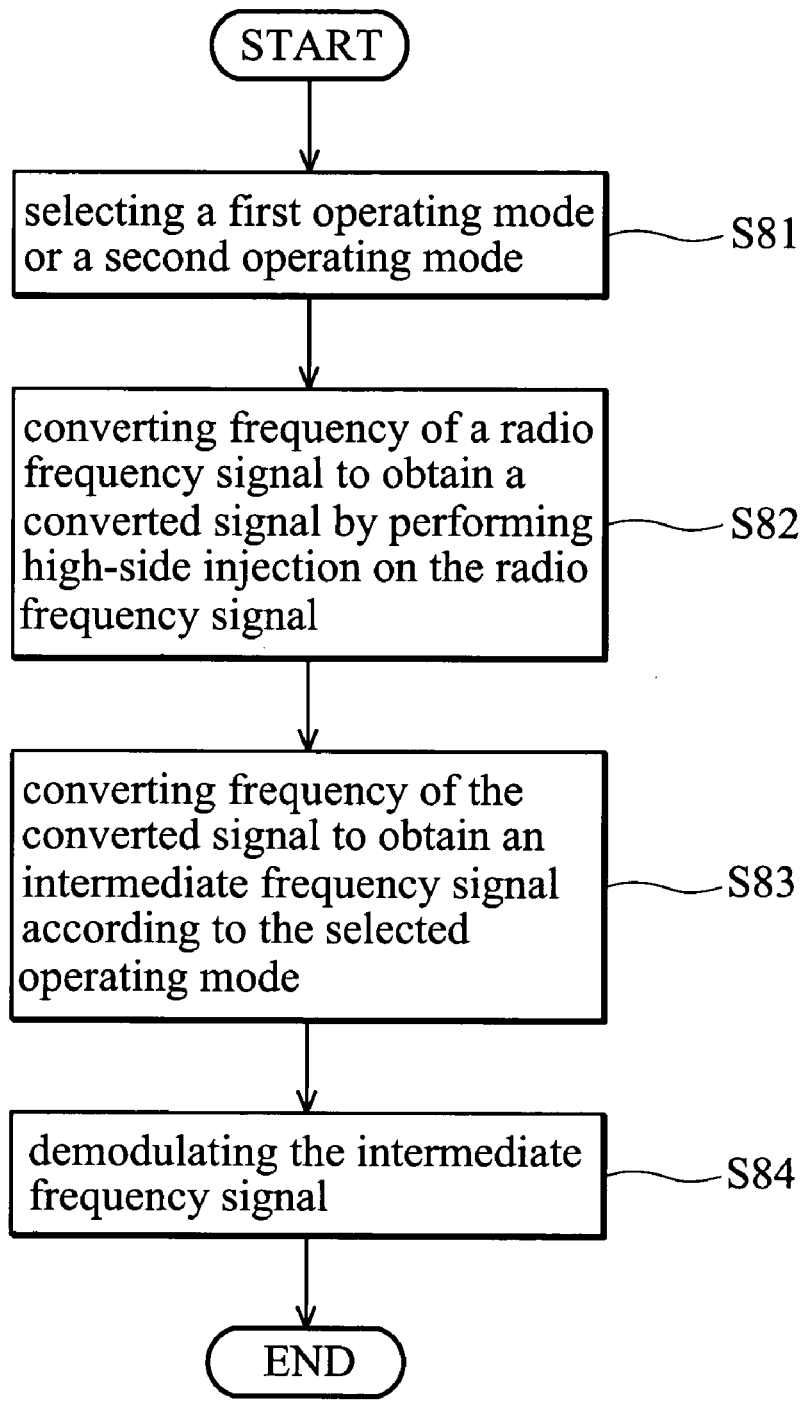
FIG. 8 is a flow chart of an embodiment of a TV tuning method.

As shown in FIG. 8, in step S81, a first operating mode or a second operating mode is selected according to a preset parameter or an automatically defined parameter.

In step S82, frequency of the RF signal is converted to obtain a converted signal, by an up conversion, which comprises high-side injection, on the RF signal.

In step S83, frequency of the converted signal is converted to obtain an intermediate frequency signal by a down conversion. When the first operating mode is selected, the intermediate frequency signal is obtained by performing low-side injection on the converted signal. When the second operating mode is selected, the intermediate frequency signal is obtained by performing high-side injection on the converted signal.

In step S84, the intermediate frequency signal is demodulated to output a baseband frequency signal comprising video and audio signals, or to output the signals individually.

Figure 9:
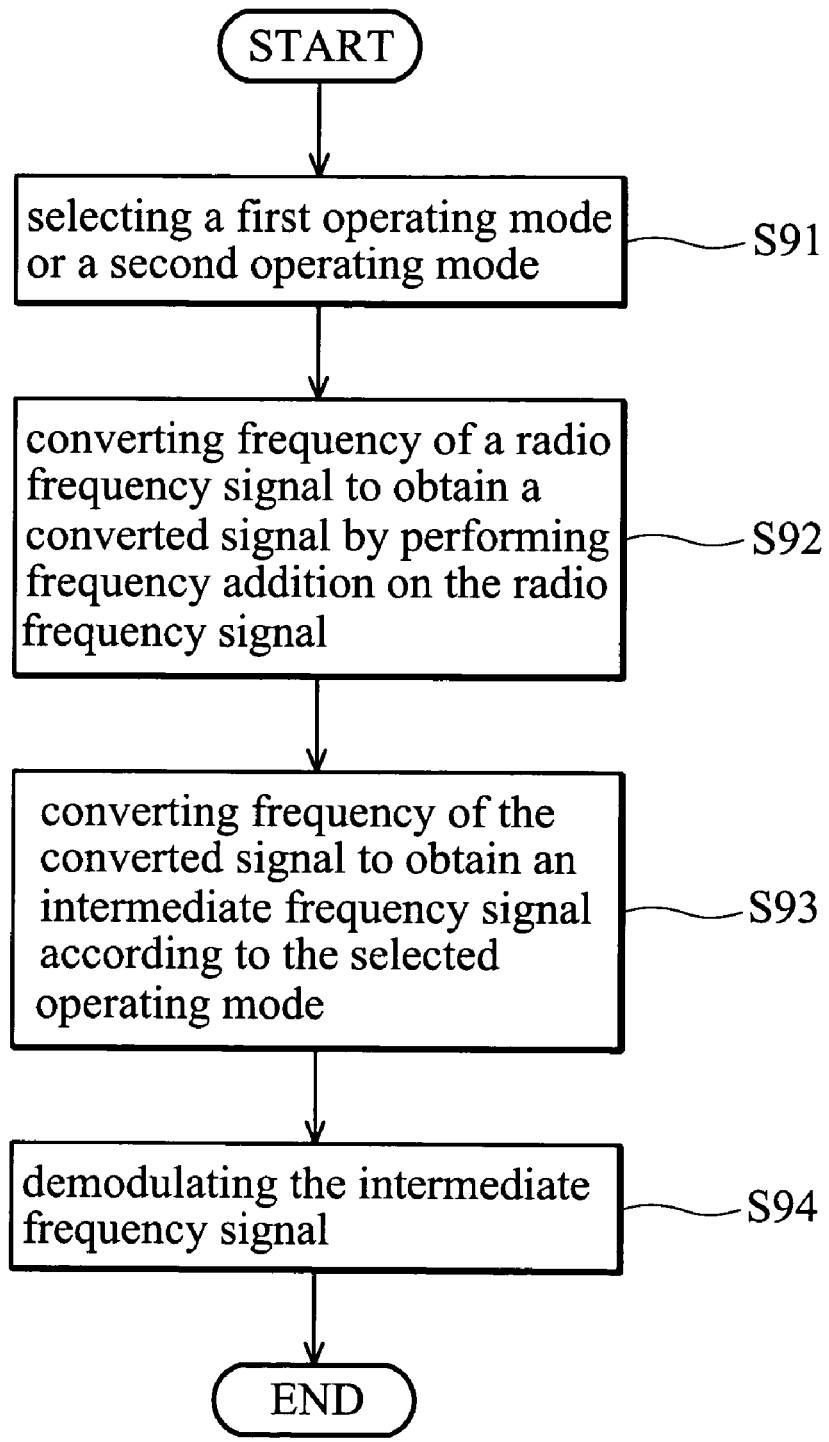
FIG. 9 is a flow chart of an embodiment of a TV tuning method.

As shown in FIG. 9, in step S91, a first operating mode or a second operating mode is selected according to a preset parameter or an automatically defined parameter.

In step S92, frequency of the RF signal is converted to obtain a converted signal by an up conversion, which comprises frequency addition, on the RF signal.

In step S93, frequency of the converted signal is converted to obtain an intermediate frequency signal by a down conversion. When the first operating mode is selected, the intermediate frequency signal is obtained by performing low-side injection on the converted signal. When the second operating mode is selected, the intermediate frequency signal is obtained by performing high-side injection on the converted signal.

In step S94, the intermediate frequency signal is demodulated to output a baseband frequency signal comprising video and audio signals, or to output the signals individually.

While the invention has been described by way of example and in terms of several embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements

What is claimed is:

1. A TV tuner for receiving a radio frequency (RF) signal, comprising:
   a first frequency converting circuit switchable between a first operating mode and a second operating mode, receiving the RF signal and outputting a converted signal, wherein the first frequency converting circuit performs high-side injection on the RF signal to obtain the converted signal in the first operating mode, and performs frequency addition on the RF signal to obtain the converted signal in the second operating mode; and
   a second frequency converting circuit performing a down conversion on the converted signal from the first frequency converting circuit to obtain an intermediate frequency signal.

2. The TV tuner as claimed in claim 1, wherein the RF signal is a television signal comprising video and audio signals.

3. The TV tuner as claimed in claim 1, wherein the RF signal is received by an antenna or a cable.

4. The TV tuner as claimed in claim 1, wherein the down conversion comprises low-side injection or high-side injection.

5. The TV tuner as claimed in claim 1, further comprising a demodulator demodulating the intermediate frequency signal and outputting a baseband frequency signal comprising video and audio signals or outputting the signals individually.

6. The TV tuner as claimed in claim 1, wherein the first frequency converting circuit comprises a mixer receiving the RF signal and an oscillation signal to output the converted signal, wherein frequency of the oscillation signal is higher than a carrier frequency of the RF signal in the first operating mode and is lower than a carrier frequency of the converted signal in the second operating mode.

7. The TV tuner as claimed in claim 1, wherein the first frequency converting circuit comprises:
   a mixer receiving the RF signal and an oscillation signal to obtain a mixed signal, wherein frequency of the oscillation signal is higher than a carrier frequency of the RF signal in the first operating mode and is lower than a carrier frequency of the mixed signal in the second operating mode; and
   a band-pass filter filtering the mixed signal to output the converted signal.

8. The TV tuner as claimed in claim 1, wherein the first frequency converting circuit comprises:
   a mixer receiving the RF signal and an oscillation signal to obtain a mixed signal, wherein frequency of the oscillation signal is higher than a carrier frequency of the RF signal in the first operating mode and is lower than a carrier frequency of the mixed signal in the second operating mode;
   an amplifier amplifying the mixed signal; and
   a band-pass filter filtering the amplified mixed signal to output the converted signal.

9. The TV tuner as claimed in claim 1, wherein the second frequency converting circuit comprises a mixer receiving the converted signal and an oscillation signal to output the intermediate frequency signal, wherein frequency of the oscillation signal is lower than a carrier frequency of the converted signal.

10. The TV tuner as claimed in claim 1, wherein the second frequency converting circuit comprises:
   a mixer receiving the converted signal and an oscillation signal to obtain a mixed signal, wherein frequency of the oscillation signal is lower than a carrier frequency of the converted signal; and
   a band-pass filter filtering the mixed signal to output the intermediate frequency signal.

11. The TV tuner as claimed in claim 1, wherein the second frequency converting circuit comprises:
   a mixer receiving the converted signal and an oscillation signal to obtain a mixed signal, wherein frequency of the oscillation signal is lower than a carrier frequency of the converted signal; and
   an amplifier amplifying the mixed signal; and
   a band-pass filter filtering the amplified mixed signal to output the intermediate frequency signal.

12. The TV tuner as claimed in claim 1, wherein the first frequency converting circuit is converted between the first and second operating modes according to a preset parameter or an automatic-defined parameter.

13. A TV tuner receiving a radio frequency (RF) signal, the TV tuner comprising:
   a first frequency converting circuit performing an up conversion on the RF signal to obtain a converted signal; and
   a second frequency converting circuit switchable between a first operating mode and a second operating mode, receiving the converted signal and outputting an intermediate frequency signal, wherein the second frequency converting circuit performs low-side injection on the converted signal to obtain the intermediate frequency signal in the first operating mode, and performs high-side injection on the converted signal to obtain the intermediate frequency signal in the second operating mode.

14. The TV tuner as claimed in claim 13, wherein the RF signal is a television signal comprising video and audio signals.

15. The TV tuner as claimed in claim 13, wherein the RF signal is received by an antenna or a cable.

16. The TV tuner as claimed in claim 13, wherein the up conversion comprises high-side injection or frequency addition.

17. The TV tuner as claimed in claim 13, further comprising a demodulator demodulating the intermediate frequency signal and outputting a baseband frequency signal comprising video and audio signals or outputting the signals individually.

18. The TV tuner as claimed in claim 13, wherein the second frequency converting circuit comprises a mixer receiving the converted signal and an oscillation signal to output the intermediate frequency signal, wherein frequency of the oscillation signal is lower than a carrier frequency of the converted signal in the first operating mode and is higher than the carrier frequency of the converted signal in the second operating mode.

19. The TV tuner as claimed in claim 13, wherein the second frequency converting circuit comprises:
   a mixer receiving the converted signal and an oscillation signal to obtain a mixed signal, wherein frequency of the oscillation signal is lower than a carrier frequency of the converted signal in the first operating mode and is higher than the carrier frequency of the converted signal in the second operating mode; and
   a band-pass filter filtering the mixed signal to output the intermediate frequency signal.

20. The TV tuner as claimed in claim 13, wherein the second frequency converting circuit comprises:
   a mixer receiving the converted signal and an oscillation signal to obtain a mixed signal, wherein frequency of the oscillation signal is lower than a carrier frequency of the converted signal in the first operating mode and is higher than the carrier frequency of the converted signal in the second operating mode;
   an amplifier amplifying the mixed signal; and
   a band-pass filter filtering the amplified mixed signal to output the intermediate frequency signal.

21. The TV tuner as claimed in claim 13, wherein the first frequency converting circuit comprises a mixer receiving the RF signal and an oscillation signal to output the converted signal, wherein frequency of the oscillation signal is higher than a carrier frequency of the RF signal.

22. The TV tuner as claimed in claim 13, wherein the first frequency converting circuit comprises:
   a mixer receiving the RF signal and an oscillation signal to obtain a mixed signal, wherein frequency of the oscillation signal is higher than a carrier frequency of the RF signal; and
   a band-pass filter filtering the mixed signal to output the converted signal.

23. The TV tuner as claimed in claim 13, wherein the first frequency converting circuit comprises:
   a mixer receiving the RF signal and an oscillation signal to obtain a mixed signal, wherein frequency of the oscillation signal is higher than a carrier frequency of the RF signal; and
   an amplifier amplifying the mixed signal; and
   a band-pass filter filtering the amplified mixed signal to output the converted signal.

24. The TV tuner as claimed in claim 13, wherein the second frequency converting circuit is converted between the first and second operating modes according to a preset parameter or an automatic-defined parameter.

25. A TV tuning method for receiving a radio frequency (RF) signal with video and audio signals, comprising:
   selecting a first operating mode or a second operating mode according to a preset parameter or an automatically defined parameter;
   converting frequency of the RF signal to obtain a converted signal by performing high-side injection on the RF signal when the first operating mode is selected, and by performing frequency addition on the RF signal when the second operating mode is selected;
   converting frequency of the converted signal to obtain an intermediate frequency signal by performing a down conversion; and
   demodulating the intermediate frequency signal to output the video and audio signals.

26. The TV tuning method as claimed in claim 25, wherein the down conversion comprises low-side injection or high-side injection.

27. A TV tuning method for receiving a radio frequency (RF) signal with video and audio signals, comprising:
   selecting a first operating mode or a second operating mode according to a preset parameter or an automatically defined parameter;

converting frequency of the RF signal to obtain a converted signal by performing an up conversion;

converting frequency of the converted signal to obtain an intermediate frequency signal by performing low-side injection on the converted signal when the first operating mode is selected, and by performing high-side injection on the converted signal when the second operating mode is selected; and demodulating the intermediate frequency signal to output the video and audio signals.

28. The TV tuning method as claimed in claim 27, wherein the up conversion comprises high-side injection or frequency addition.

* * * * *